(12) United States Patent
Li et al.

(10) Patent No.: US 6,852,429 B1
(45) Date of Patent: Feb. 8, 2005

(54) ORGANIC ELECTROLUMINESCENT DEVICE BASED ON PYRENE DERIVATIVES

(75) Inventors: Xiao-Chang Charles Li, Union City, CA (US); Yoshimasa Okamura, Sunnyvale, CA (US); Kazunori Ueno, Ebina (JP); Masashi Tashiro, Los Angeles, CA (US); Hideki Tashiro, Los Angeles, CA (US); G. K. Surya Prakash, Los Angeles, CA (US)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 10/634,755

(22) Filed: Aug. 6, 2003

(51) Int. Cl.[7] .............................................. H05B 33/14

(52) U.S. Cl. .................. 428/690; 428/917; 252/301.16; 252/301.35; 313/504; 313/506; 257/40; 257/103

(58) Field of Search ................................. 428/690, 704, 428/917; 252/301.16, 301.35; 313/504, 506; 257/40, 103

(56) References Cited

U.S. PATENT DOCUMENTS

| | | | |
|---|---|---|---|
| 2,011,789 A | 8/1935 | Wulff et al. | 260/168 |
| 2,109,833 A | 3/1938 | Zerweck et al. | 260/168 |
| 2,157,544 A | 5/1939 | Kline | 18/54 |
| 3,000,984 A | 9/1961 | Halleux | 260/668 |
| 3,549,361 A | 12/1970 | Miller | 96/1.5 |
| 3,711,567 A | 1/1973 | Innes | 260/668 |
| 4,401,585 A | 8/1983 | Arthen, Jr. et al. | 252/188.3 |
| 4,956,508 A | 9/1990 | Michel et al. | 585/26 |
| 5,059,708 A | 10/1991 | Aruga et al. | 558/714 |
| 5,121,029 A | 6/1992 | Hosokawa et al. | 313/504 |
| 5,601,903 A | 2/1997 | Fujii et al. | 428/212 |
| 5,635,308 A | 6/1997 | Inoue et al. | 428/690 |
| 5,728,480 A | 3/1998 | Stern et al. | 428/690 |
| 5,759,444 A | 6/1998 | Enokida et al. | 252/301.16 |
| 5,811,833 A | 9/1998 | Thompson | 257/40 |
| 5,853,905 A | 12/1998 | So et al. | 428/690 |
| 5,858,563 A | 1/1999 | Sano et al. | 428/690 |
| 5,858,564 A | 1/1999 | Tamura et al. | 428/690 |
| 5,885,498 A | 3/1999 | Matsuo et al. | 252/583 |
| 5,935,721 A | 8/1999 | Shi et al. | 428/690 |
| 5,972,247 A | 10/1999 | Shi et al. | 252/583 |
| 6,004,685 A | 12/1999 | Antoniadis et al. | 428/690 |
| 6,013,383 A | 1/2000 | Shi et al. | 428/690 |
| 6,093,864 A | 7/2000 | Tokailin et al. | 585/25 |
| 6,150,042 A | 11/2000 | Tamano et al. | 428/690 |
| 6,245,449 B1 | 6/2001 | Tamano et al. | 428/690 |
| 6,251,531 B1 | 6/2001 | Enokida et al. | 428/690 |
| 6,288,486 B1 | 9/2001 | Tsuruoka et al. | 313/504 |
| 6,329,083 B1 | 12/2001 | Toguchi et al. | 428/690 |
| 6,361,885 B1 | 3/2002 | Chou | 428/690 |
| 6,361,886 B2 | 3/2002 | Shi et al. | 428/690 |
| 6,361,887 B1 | 3/2002 | Shi et al. | 428/690 |
| 6,387,547 B1 | 5/2002 | Fujita et al. | 428/690 |
| 6,399,223 B1 | 6/2002 | Fujita et al. | 428/690 |
| 2001/0031378 A1 | 10/2001 | Kreuder et al. | |
| 2002/0022150 A1 | 2/2002 | Toguchi et al. | |
| 2002/0028346 A1 | 3/2002 | Shi et al. | |
| 2002/0048686 A1 | 4/2002 | Suzuki et al. | |
| 2002/0048687 A1 | 4/2002 | Hosokawa et al. | |

(List continued on next page.)

FOREIGN PATENT DOCUMENTS

| | | |
|---|---|---|
| JP | 2001/192651 | 7/2001 |
| JP | 2002/329580 | 11/2002 |

OTHER PUBLICATIONS

Miura, Yozo et al., J. Org. Chem., (1997), vol. 62, pp. 1188–1190.*
Miura, Yozo et al., J. Org. Chem., (1995), vol. 60, pp. 1070–1073.*
Munoz, Anna et al., J. Org. Chem., (2000), vol. 65, pp. 5069–5071.*

*Primary Examiner*—Dawn Garrett
(74) *Attorney, Agent, or Firm*—Fitzpatrick, Cella, Harper & Scinto

(57) ABSTRACT

A pyrene based compound and its use in an organic light emitting device (OLED) according to the following formula:

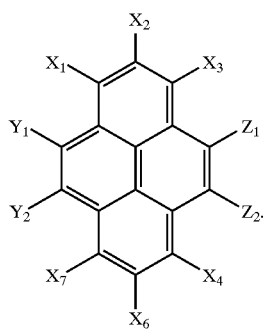

In the above formula, $Z_1$ represents a hydrogen atom, deuterium atom, oxygen atom, silicon atom, selenium atom, substituted or unsubstituted aryl group, substituted or unsubstituted heteroaryl group, substituted or unsubstituted aryl amine or a combination thereof, and $Z_2$ represents a hydrogen or deuterium atom. One of $Y_1$ and $Y_2$ represents a hydrogen atom, deuterium atom, oxygen atom, silicon atom, selenium atom, a substituted or unsubstituted aryl group, substituted or unsubstituted heteroaryl group, substituted or unsubstituted aryl amine or a combination thereof, and the other of $Y_1$ and $Y_2$ represents a hydrogen or deuterium atom. $X_1$ through $X_6$ independently represent hydrogen atoms, deuterium atoms, alkyl groups or aryl groups, and at least one of $X_1$ through $X_6$ represents a bulky alkyl group or bulky aryl group. Also, at least one of $X_1$ through $X_6$, $Y_1$, $Y_2$, $Z_1$, and $Z_2$ represents a deuterium atom. The pyrene based compounds of this invention are useful in emissive layers, hole transport layers, or electron transport layers of an organic light emitting device (OLED). Within these layers, the pyrene based compound can serve directly to constitute the layers or as a host and/or dopant.

33 Claims, 1 Drawing Sheet

U.S. PATENT DOCUMENTS

2002/0048688 A1 4/2002 Fukuoka et al.
2002/0055013 A1 5/2002 Kim et al.
2002/0061419 A1 5/2002 Woo et al.
2002/0061420 A1 5/2002 Sohn et al.
2002/0064679 A1 5/2002 Ishiskawa et al.
2002/0177009 A1 11/2002 Suzuki et al.

* cited by examiner

ORGANIC ELECTROLUMINESCENT DEVICE BASED ON PYRENE DERIVATIVES

BACKGROUND OF THE INVENTION

1. Field of the Invention

The present invention relates to pyrene based compounds and materials and their use in organic light emitting devices. These pyrene based compounds and materials can be used as the emissive layer, electron transport layer, hole transport layer or one or more of such layers, although their use as a blue emissive layer is preferred. These compounds can also be used as a host or dopant material for one or more of such layers.

2. Description of the Related Art

Organic light emitting devices (OLEDS) typically comprise a layer of emissive material between an anode and a cathode. When a bias is applied across the electrodes, positive charges (holes) and negative charges (electrons) are respectively injected from the anode and cathode into the emissive layer. The holes and the electrons form excitons in the emissive layer to emit light.

Electrodes are chosen to facilitate charge injection. A transparent indium-tin-oxide (ITO) anode has a relatively high work function and is therefore suitable for use as a hole injection electrode, while low work function metals such as Al, Mg and Ca are suitable for injection of electrons.

To improve the power efficiency of an OLED, it is frequently desirable to enhance charge injection at the electrode interface. Hole transport layers and electron transport layers may be added adjacent to the respective electrodes to facilitate charge transfer. Depending upon whether hole transport or electron transport is favored, the light emissive layer may be located closer to the anode or the cathode. In some instances, the emissive layer is located within the hole transport or electron transport layer.

Improved performance can be obtained if blocking layers are provided to block against the injection of either holes or electrons from the adjoining layer and their subsequent escape from the device. Likewise, a modifying layer may be used to improve the contact with one or both of the electrodes, or to improve the interface between two other layers.

Some of these layers can be combined. For example, a double-layered structure is fabricated from a combined hole-injecting and transporting layer together with a combined electron-transporting and light-emitting layer. Likewise, a triple-layered structure is composed of a hole-injecting and transporting layer, a light-emitting layer, and an electron-injecting and transporting layer.

Hole transport layers may include triarylamnine-based materials, although many other hole transport materials are known. Likewise, an aluminum quinolinolate complex known as AlQ$_3$ is a well known electron-transport material which has been used in OLEDs, although other electron transport materials are known.

Emissive materials having widely varied structures are known in the art and are generally selected based on color, brightness, efficiency and lifetime. These emissive materials may themselves also have electron transport or hole transport characteristics.

In addition, it is possible to form these layers from a "host" material doped with another material (the "guest" material) designed to achieve the desired effect of the layer (for example, to achieve a hole transport effect, an electron transport effect, or an emissive effect). In the case of an emissive guest-host system, the host must be able to transfer energy to the guest so that a maximum amount of energy contributes to emission by the guest rather than being absorbed by the host.

Fused aromatic ring compounds have been used in the layers of organic light emitting devices. Their advanced pi-delocalization system, high mobility and good photoluminescence are desired qualities for OLED application.

Pyrene is a fused aromatic ring compound. In solution, pyrene fluoresces purple blue, yet in solid state it fluoresces white. This white light is due to intermolecular aggregation.

Since blue emissive materials are desired, it has been considered to prevent aggregation in pyrene by attaching pyrene to a benzene ring at the 1, 3, and 5 position to make 1,3,5-tripyrene benzene (3TPB), as follows:

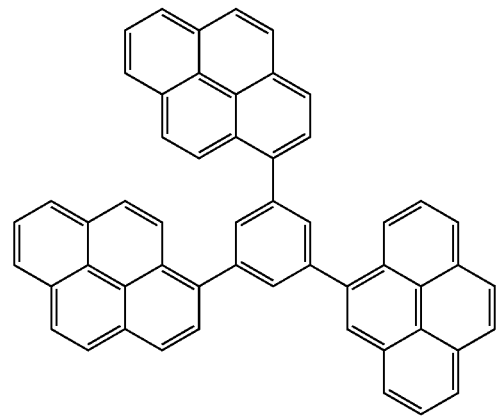

This arrangement results in a good blue emissive material with a peak emission at 450 nm. However, closer investigation of 3TPB reveals that the compound still has a minor aggregation problem in its solid state, resulting in a shoulder emission at 482 nm and reduced blue color purity.

There continues to be a need for OLED materials exhibiting thermal stability, having bright, high purity luminescent emission, and for materials which contribute to greater luminescence per injected charge. There is particularly a need for OLED materials which provide a good blue emission.

SUMMARY OF THE INVENTION

As noted above, pyrene based materials are capable of producing blue emissions that have good color purity. However, due to the tendency to aggregate, the blue emission of these materials is tainted by emissions of other wavelengths.

It is an object of the present invention to provide a pyrene based material for OLED application which will have reduced aggregation problems and, hence, improved blue emission purity.

Thus, in one aspect, the invention is a pyrene based compound according to the following general formula (1):

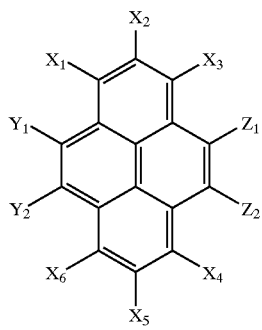

(I)

wherein $Z_1$ represents a hydrogen atom, deuterium atom, oxygen atom, silicon atom, selenium atom, substituted or unsubstituted aryl group, substituted or unsubstituted heteroaryl group, substituted or unsubstituted aryl amine or a combination thereof, and $Z_2$ represents a hydrogen or deuterium atom;

wherein one of $Y_1$ and $Y_2$ represents a hydrogen atom, deuterium atom, oxygen atom, silicon atom, selenium atom, a substituted or unsubstituted aryl group, substituted or unsubstituted heteroaryl group, substituted or unsubstituted aryl amine or a combination thereof, and the other of $Y_1$ and $Y_2$ represents a hydrogen or deuterium atom;

wherein $X_1$ through $X_6$ independently represent hydrogen atoms, deuterium atoms, alkyl groups or aryl groups, and at least one of $X_1$ through $X_6$ represents a bulky alkyl group or bulky aryl group; and wherein at least one of $X_1$ through $X_6$, $Y_1$, $Y_2$, $Z_1$, and $Z_2$ represents a deuterium atom.

In one embodiment of the present invention, $Z_1$, $Y_1$ and $Y_2$ independently represent hole injection chromophores, electron injection chromophores, or both. $Z_1$, $Y_1$ and $Y_2$ independently may also represent a cross-linking group. Preferably, the cross-linking group comprises a di-vinyl group. Finally, $Z_1$, $Y_1$ and $Y_2$ independently may represent a benzene ring substituted with one or two pyrenyl groups.

Optionally, $X_1$ through $X_5$ independently represent a tert-butyl group or a triphenyl silane.

In a preferred embodiment, both $X_2$ and $X_5$ represent a bulky alkyl group or bulky aryl group and more preferably, the same bulky alkyl or bulky aryl group.

The following structures are examples of the pyrene based compounds of the present invention.

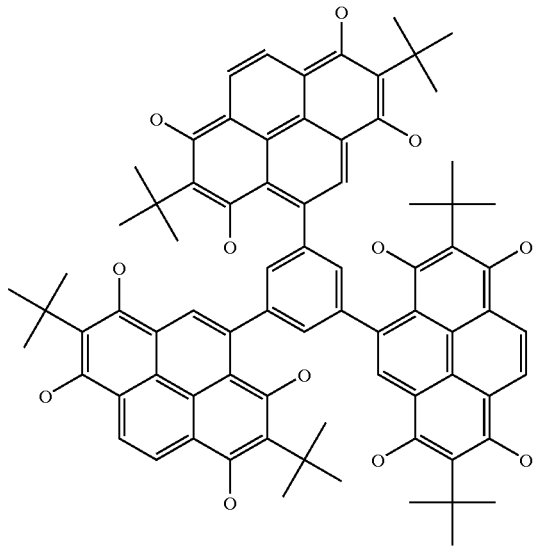

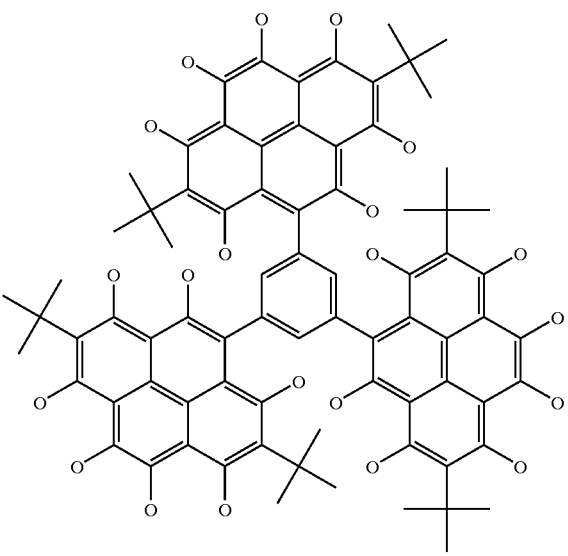

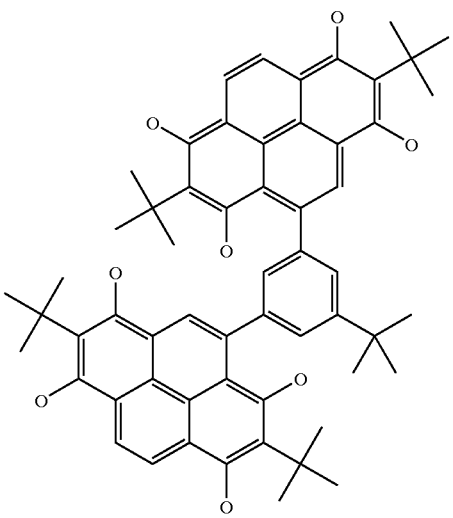

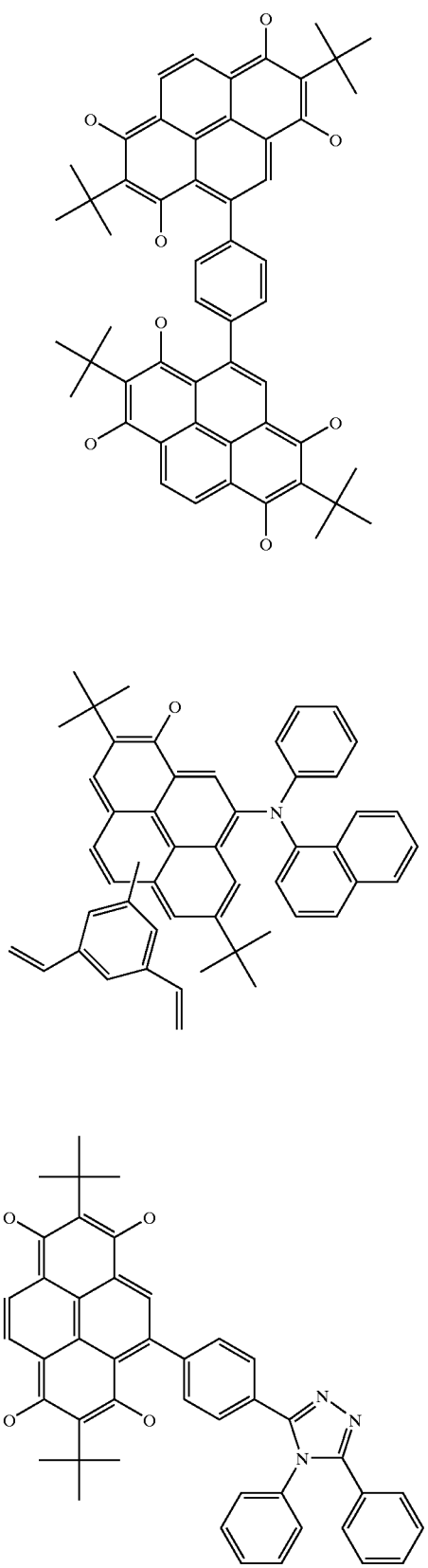
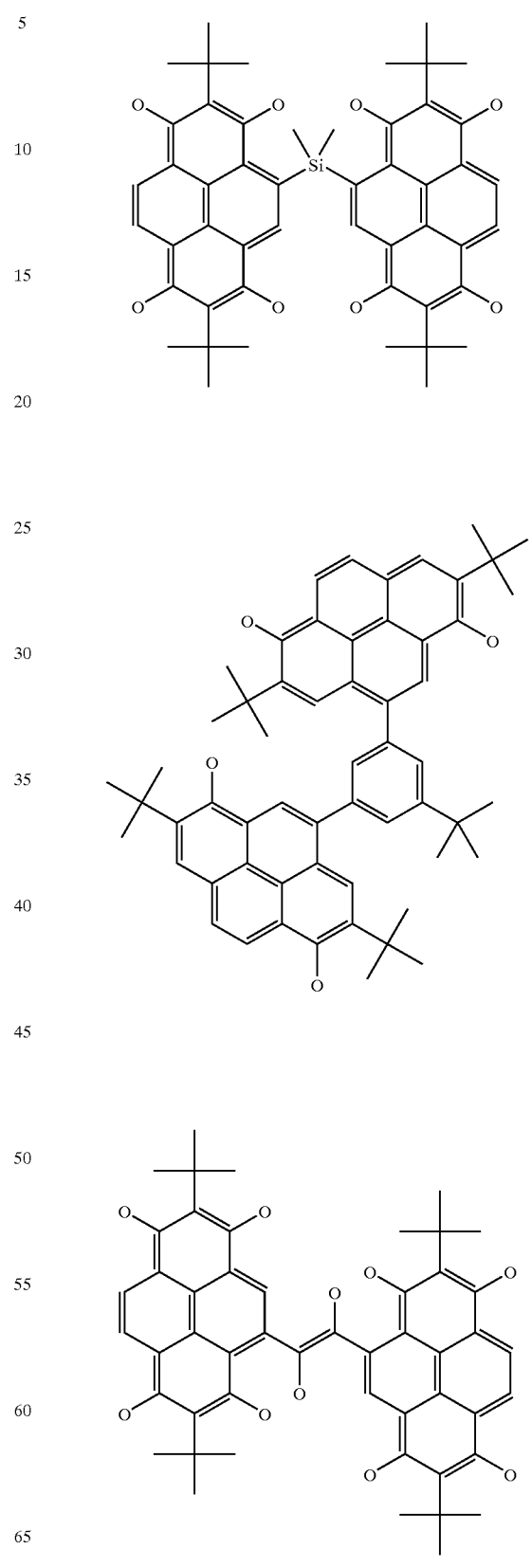

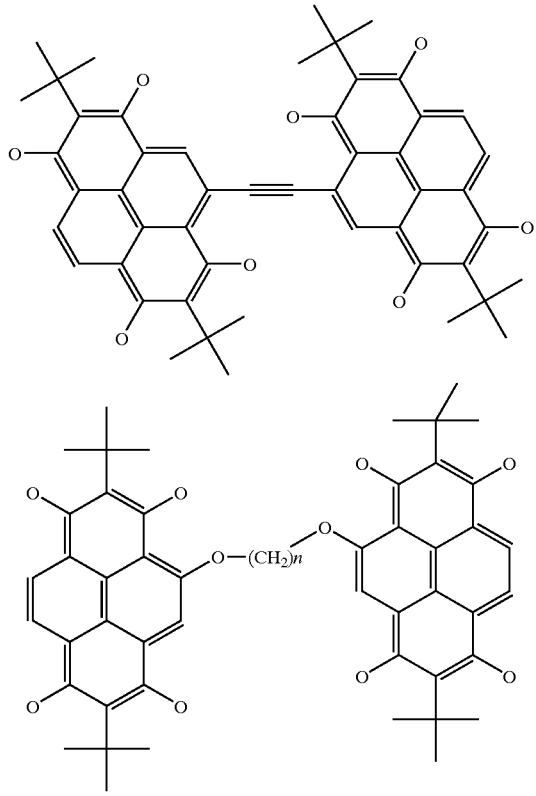

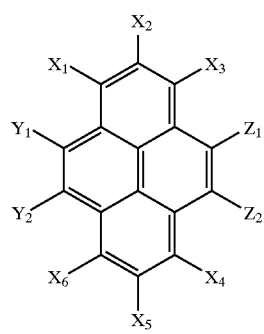

Another aspect of the present invention is an OLED in which at least one organic layer is sandwiched between an anode and a cathode, and in which the organic layer includes a pyrene based compound as described above. The organic layers of an OLED in which the compound can be used include a hole transport layer, an electron transport layer or an missive layer.

In an emissive layer, the pyrene based compound can be used directly as the emissive layer or can be used as a host material for an emissive dopant in a case where the emissive layer comprises a pyrene based host plus an emissive dopant. The emissive dopant can also be the pyrene based compound described above. Preferably, the emissive layer emits in blue wavelengths.

Alternatively, the pyrene based compound can be used directly as the hole can form a charge transport host material in a case where the charge transport layer comprises a host material plus a charge transport dopant.

Optionally, the OLEDs of the present invention contain a pyrene based compound wherein $Z_1$, $Y_1$ and $Y_2$ independently represent hole injection chromophores, electron injection chromophores, or both.

This brief summary has been provided so that the nature of the invention may be understood quickly. A more complete understanding of the invention can be obtained by reference to the following detailed description of the preferred embodiment thereof in connection with the attached drawings.

DETAILED DESCRIPTION OF THE INVENTION

The pyrene based compound of the present invention has the following general formula (I):

wherein $Z_1$ represents a hydrogen atom, deuterium atom, oxygen atom, silicon atom, selenium atom, substituted or unsubstituted aryl group, substituted or unsubstituted heteroaryl group, substituted or unsubstituted aryl amine or a combination thereof, and $Z_2$ represents a hydrogen or deuterium atom;

wherein one of $Y_1$ and $Y_2$ represents a hydrogen atom, deuterium atom, oxygen atom, silicon atom, selenium atom, a substituted or unsubstituted aryl group, substituted or unsubstituted heteroaryl group, substituted or unsubstituted aryl amine or a combination thereof, and the other of $Y_1$ and $Y_2$ represents a hydrogen or deuterium atom;

wherein $X_1$ through $X_6$ independently represent hydrogen atoms, deuterium atoms, alkyl groups or aryl groups, and at least one of $X_1$ through $X_6$ represents a bulky alkyl group or bulky aryl group; and wherein at least one of $X_1$ through $X_6$, $Y_1$, $Y_2$, $Z_1$, and $Z_2$ represents a deuterium atom.

In one embodiment of the present invention, $Z_1$, $Y_1$ and $Y_2$ independently represent hole injection chromophores, electron injection chromophores, or both. $Z_1$, $Y_1$ and $Y_2$ independently may also represent a cross-linking group. Preferably, the cross-linking group comprises a di-vinyl group. Finally, $Z_1$, $Y_1$ and $Y_2$ independently may represent a benzene ring substituted with one or two pyrenyl groups.

Optionally, $X_1$ through $X_6$ independently represent a tert-butyl group or a triphenyl silane.

In a preferred embodiment, both $X_2$ and $X_5$ represent a bulky alkyl group or bulky aryl group and more preferably, the same bulky alkyl or bulky aryl group.

A pyrene based compound expressed according to the above formula can be made with methods known in the art.

Some preferred pyrene based compounds represented by the above formula include:

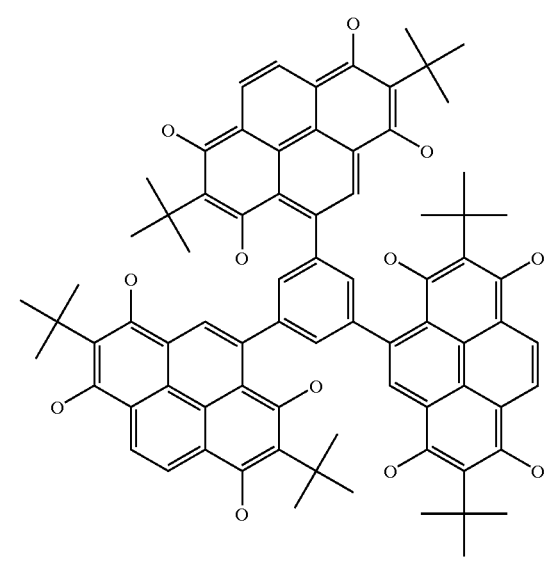
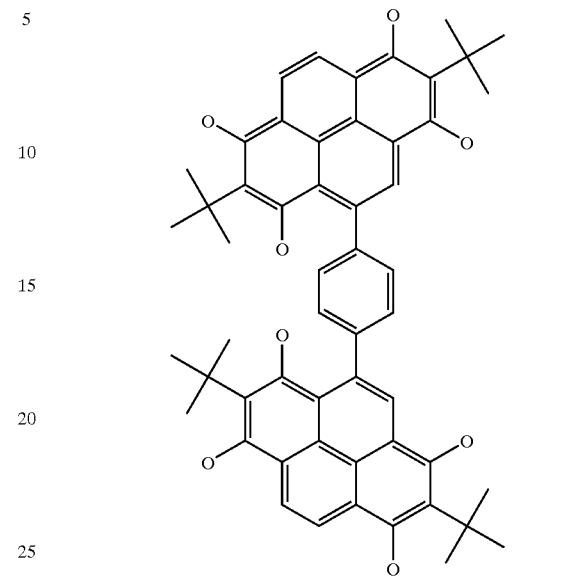
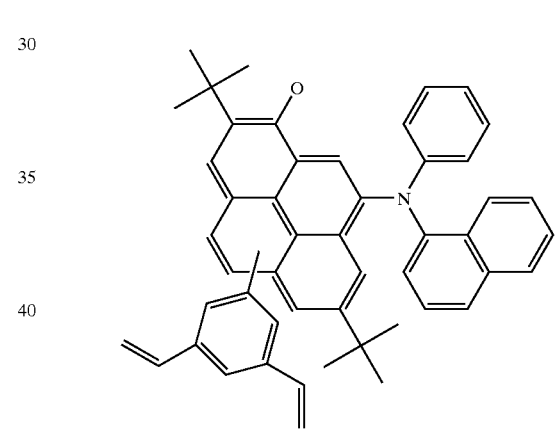
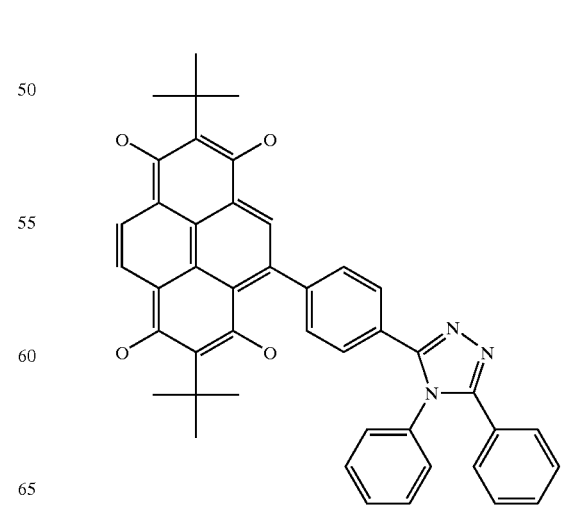

-continued

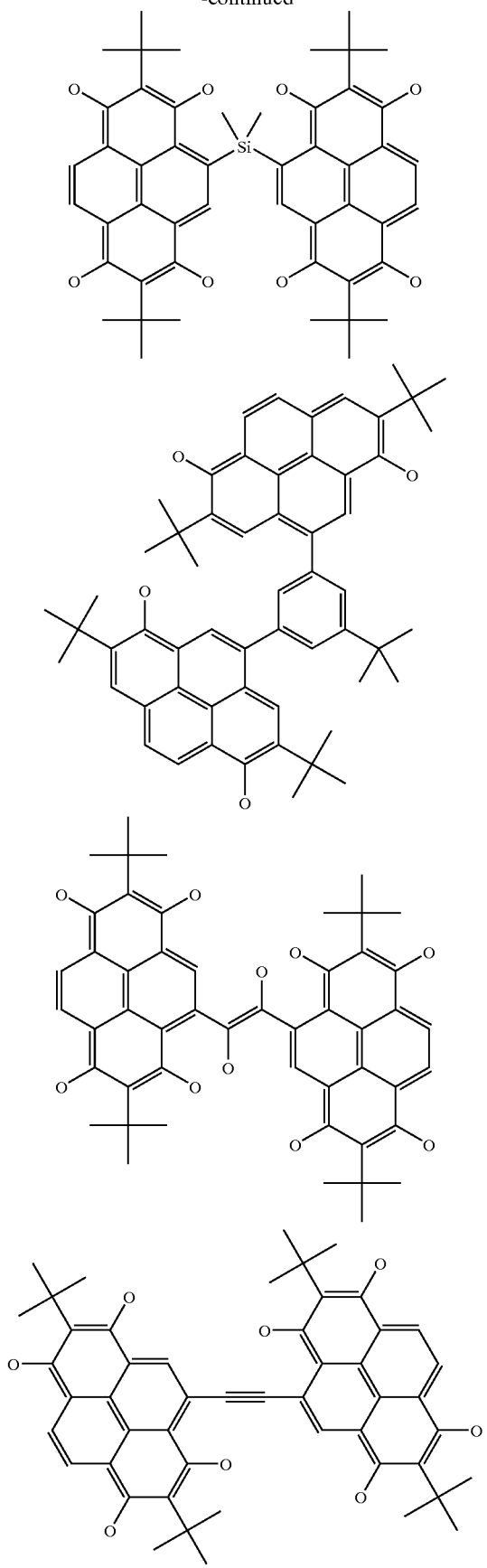

-continued

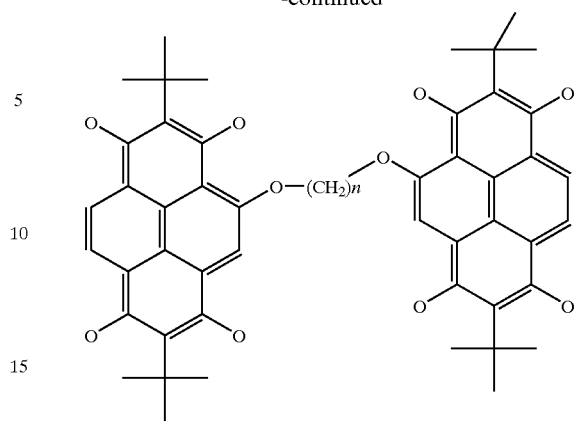

A characteristic of a pyrene based compound expressed according to the above formula is reduced intermolecular aggregation as compared to 3TPB, due to the substitution of bulky substituent groups. Such a pyrene based compound exhibits the quality of a pure blue color without aggregate emission when fluorescing. As a result, an advantage of the disclosed pyrene based materials for use in OLEDs according to the invention is that they emit a good blue hue without white photoluminescence.

The pyrene based compound expressed according to the above formula can be used in the hole transport layer, electron transport layer or emissive layer of an OLED.

An OLED may be a multi-layer device, such as a three layer device, shown in FIG. 1, as described more fully below, or a single layer device, shown in FIG. 2.

Figure 1:
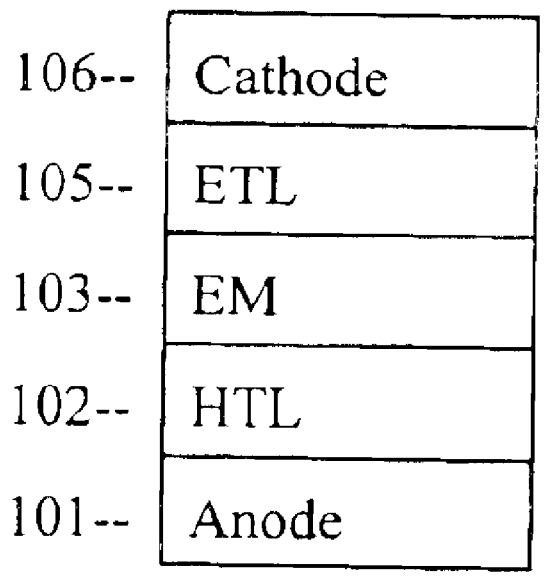
FIG. 1 is a schematic cross-sectional view of a three layer organic light emitting device.

In FIG. 1, a three layer device comprises an emissive layer 103 sandwiched between an electron transport layer 105 and a hole transport layer 102. Additionally, an electron transport layer 105 and hole transport layer 102 are sandwiched between a cathode 106 and an anode 101.

Various procedures for the fabrication of an OLED exist, including the following general procedure: To construct a three layer device, as in FIG. 1, a clean substrate coated with a patterned layer of indium tin oxide (ITO) is first obtained. Next, the substrate is treated with $O_2$ plasma for 1–5 minutes. Afterwards, the substrate is placed in a thermal evaporator and the pressure is lowered. Then, organic and metallic layers are evaporated onto the substrate at a rate approximately between 1–3 Å/s. These organic and metallic layers may vary depending upon the desired OLED. A hole transport layer 102 is usually evaporated with a thickness of ~200 Å. Next, an emissive layer 103 is evaporated, usually with a host and dopant. Normally, 100–400 Å of the emissive layer is deposited. Then, an electron transport material is evaporated to form a layer 105 that is usually 200–400 Å thick. After the evaporation of the preferred organic and metallic layers, a mask is placed adjacent to the layer to define where metal areas corresponding to cathodes are to be evaporated. Then, about 120 Å of a Li-Al alloy is evaporated to improve electron injection into the device. Finally, after about 1500 Å of Al is deposited, the evaporator is allowed to cool.

Fabrication of a suitable hole transport, electron transport or emissive layer using the pyrene based compound can be accomplished through the use of thermal deposition in a vacuum, or by spin coating of a solution thereof.

Figure 2:
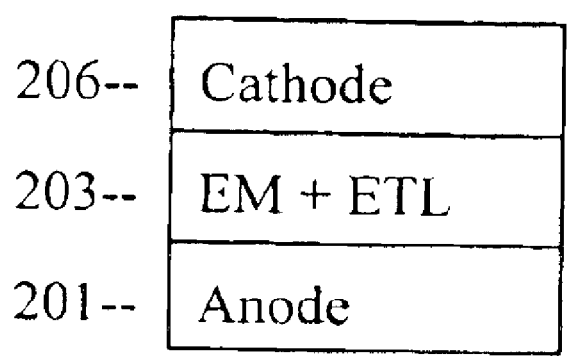
FIG. 2 is a schematic cross-sectional view of a single layer organic light emitting device.

In FIG. 2, a single layer device comprises a combined layer 203, comprising an emissive layer and an electron transport or hole transport layer, sandwiched between a cathode 206 and an anode 201.

For either a multi-layer device or a single layer device, in the emissive layer, the pyrene based compound can be used directly as the emissive layer or can as a host material for an emissive dopant in a case where the emissive layer comprises a pyrene based host plus an emissive dopant. The emissive dopant can also be the pyrene based compound described above.

Alternatively, the pyrene based compound can be used directly as the hole transport layer, the electron transport layer, or both. Furthermore, the pyrene based compound can form a charge transport host material in the case where the charge transport layer comprises a host material plus a charge transport dopant.

It is to be understood that the invention is not limited to the above-described embodiments and that various changes and modifications may be made by those of ordinary skill in the art without departing from the spirit and scope of the invention.

What is claimed is:

1. A pyrene based compound according to the following formula:

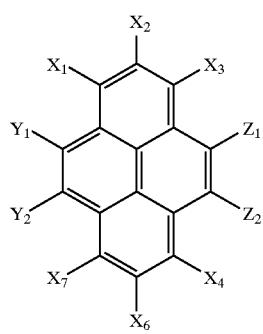

wherein $Z_1$ represents a hydrogen atom, deuterium atom, oxygen atom, silicon atom, selenium atom, substituted or unsubstituted aryl group, substituted or unsubstituted heteroaryl group, substituted or unsubstituted aryl amine or a combination thereof, and $Z_2$ represents a hydrogen or deuterium atom;

wherein one of $Y_1$ and $Y_2$ represents a hydrogen atom, deuterium atom, oxygen atom, silicon atom, selenium atom, a substituted or unsubstituted aryl group, substituted or unsubstituted heteroaryl group, substituted or unsubstituted aryl amine or a combination thereof, and the other of $Y_1$ and $Y_2$ represents a hydrogen or deuterium atom;

wherein $X_1$ through $X_6$ independently represent hydrogen atoms, deuterium atoms, alkyl groups or aryl groups, and at least one of $X_1$ through $X_6$ represents a tert-butyl group;

wherein at least one of $X_1$ through $X_6$, $Y_1$, $Y_2$, $Z_1$ and $Z_2$ represents a deuterium atom; and wherein $Z_1$ and one of $Y_1$ and $Y_2$ independently represent a hole injection chromophore, an electron injection chromophore, or both.

2. A pyrene based compound according to the following formula:

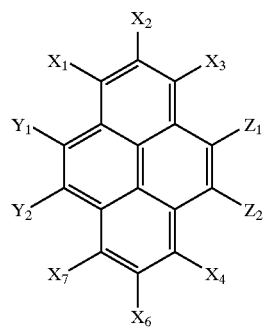

wherein $Z_1$ represents a hydrogen atom, deuterium atom, oxygen atom, silicon atom, selenium atom, substituted or unsubstituted aryl group, substituted or unsubstituted heteroaryl group, substituted or unsubstituted aryl amine or a combination thereof, and $Z_2$ represents a hydrogen or deuterium atom;

wherein one of $Y_1$ and $Y_2$ represents a hydrogen atom, deuterium atom, oxygen atom, silicon atom, selenium atom, a substituted or unsubstituted aryl group, substituted or unsubstituted heteroaryl group, substituted or unsubstituted aryl amine or a combination thereof, and the other of $Y_1$ and $Y_2$ represents a hydrogen or deuterium atom;

wherein $X_1$ through $X_6$ independently represent hydrogen atoms, deuterium atoms, alkyl groups or aryl groups, and at least one of $X_1$ through $X_6$ represents a tert-butyl group;

wherein at least one of $X_1$ through $X_6$, $Y_1$, $Y_2$, $Z_1$ and $Z_2$ represents a deuterium atom; and wherein $Z_1$ and one of $Y_1$ and $Y_2$ independently represent a cross-linking group.

3. The compound of claim 2, wherein the cross-linking group comprises a di-vinyl group.

4. A pyrene based compound according to the following formula:

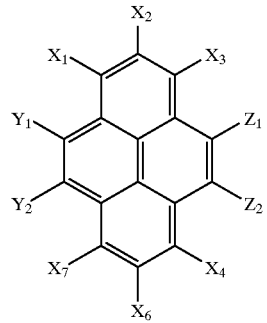

wherein $Z_1$ represents a hydrogen atom, deuterium atom, oxygen atom, silicon atom, selenium atom, substituted or unsubstituted aryl group, substituted or unsubstituted heteroaryl group, substituted or unsubstituted aryl amine or a combination thereof, and $Z_2$ represents a hydrogen or deuterium atom;

wherein one of $Y_1$ and $Y_2$ represents a substituted aryl group, and the other of $Y_1$ and $Y_2$ represents a hydrogen or deuterium atom;

wherein $X_1$ through $X_6$ independently represent hydrogen atoms, deuterium atoms, alkyl groups or aryl groups, and at least one of $X_1$ through $X_6$ represents a tert-butyl group;

wherein at least one of $X_1$ through $X_6$, $Y_1$, $Y_2$, $Z_1$, and $Z_2$ represents a deuterium atom; and wherein $Z_1$ and one of $Y_1$ and $Y_2$ independently represent a benzene ring substituted with one or two pyrenyl groups.

5. A pyrene based compound according to the following formula:

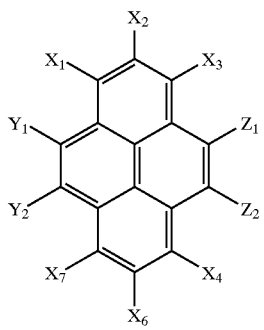

wherein $Z_1$ and $Z_2$ independently represent hydrogen atoms;

wherein one of $Y_1$ and $Y_2$ represents a substituted aryl group, and the other of $Y_1$ and $Y_2$ represents a hydrogen atom;

wherein $X_1$, $X_3$, $X_4$ and $X_6$ independently represent deuterium atoms, and $X_2$ and $X_5$ independently represent tert-butyl groups; and wherein the compound has the following structure:

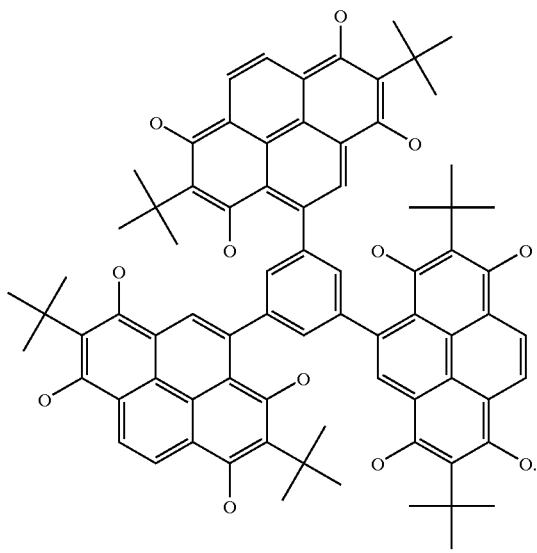

6. A pyrene based compound according to the following formula:

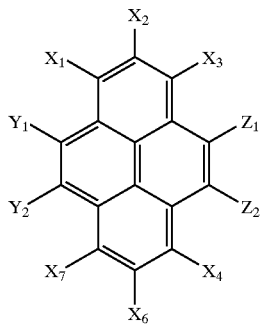

wherein $Z_1$ and $Z_2$ independently represent deuterium atoms;

wherein one of $Y_1$ and $Y_2$ represents a substituted aryl group, and the other of $Y_1$ and $Y_2$ represents a deuterium atom;

wherein $X_1$, $X_3$, $X_4$ and $X_6$ independently represent deuterium atoms, and $X_2$ and $X_5$ independently represent tert-butyl groups; and wherein the compound has the following structure:

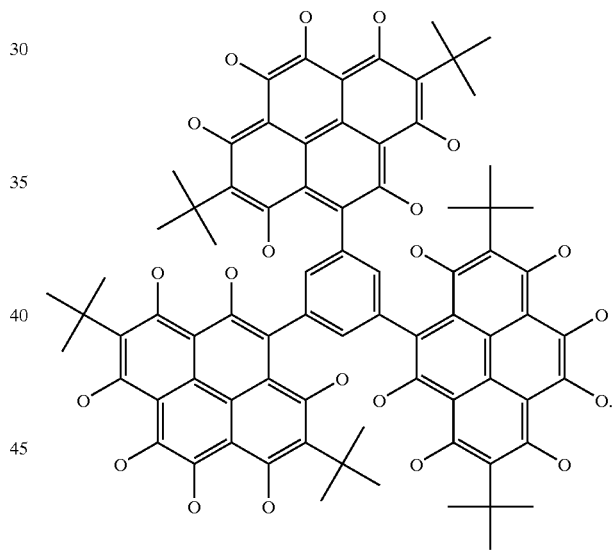

7. A pyrene based compound according to the following formula:

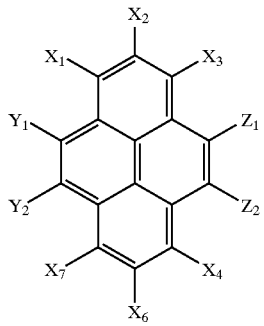

wherein $Z_1$ and $Z_2$ independently represent hydrogen atoms, wherein one of $Y_1$ and $Y_2$ represents a substituted aryl group, and the other of $Y_1$ and $Y_2$ represents a deuterium atom;

wherein $X_1$, $X_3$ $X_4$ and $X_6$ independently represent deuterium atoms, and $X_2$ and $X_5$ independently represent tert-butyl groups; and wherein the compound has the following structure:

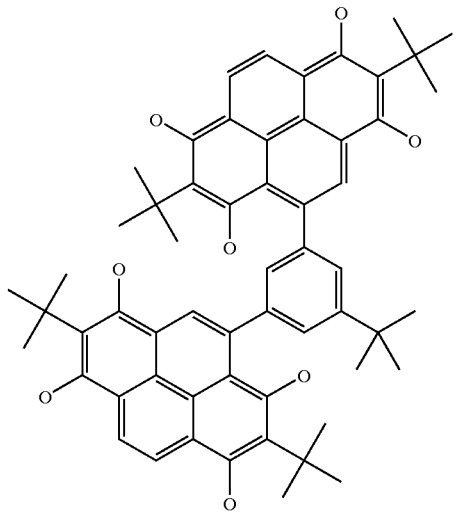

8. A pyrene based compound according to the following formula:

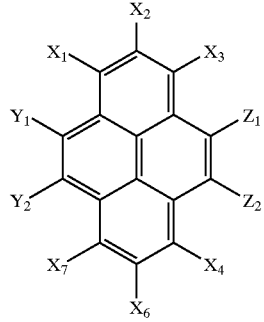

wherein $Z_1$ and $Z_2$ independently represent hydrogen atoms;

wherein one of $Y_1$ and $Y_2$ represents a substituted aryl group, and the other of $Y_1$ and $Y_2$ represents a hydrogen atom;

wherein $X_1$, and $X_3$, $X_4$ and $X_6$ independently represent deuterium atoms, and $X_2$ and $X_5$ independently represent tert-butyl groups; and wherein the compound has the following structure:

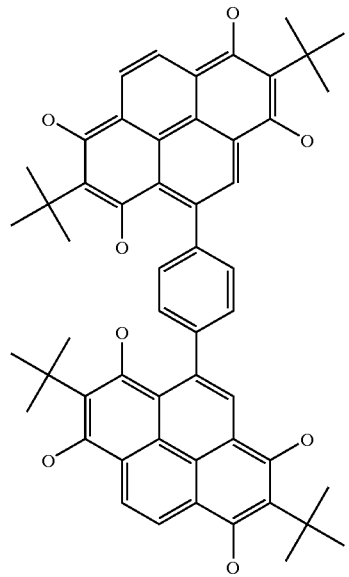

9. A pyrene based compound according to the following formula:

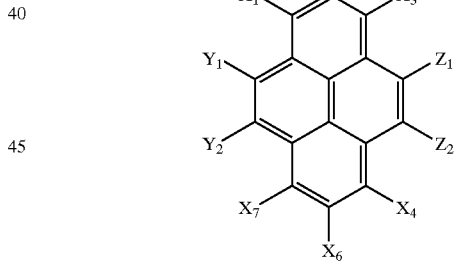

wherein $Z_1$ represents a substituted aryl amine group, and $Z_2$ represents a hydrogen atom;

wherein one of $Y_1$ and $Y_2$ represents a substituted aryl group, and the other of $Y_1$ and $Y_2$ represents a hydrogen atom;

wherein $X_1$, $X_3$ and $X_6$ independently represent hydrogen atoms $X_2$ and $X_5$ independently represent tert-butyl groups and $X_4$ represents a deuterium atom; and wherein the compound has the following structure.

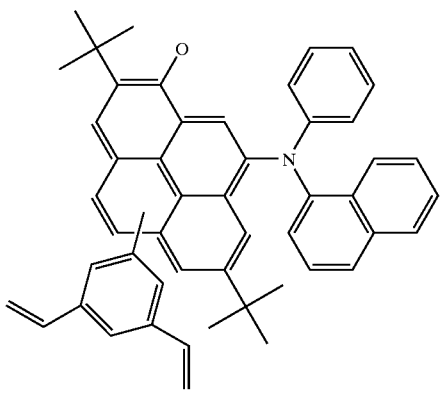

10. A pyrene based compound according to the following formula:

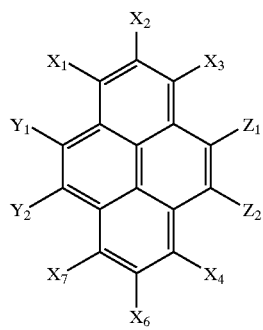

wherein $Z_1$ and $Z_2$ independently represent hydrogen atoms;

wherein one of $Y_1$ and $Y_2$ represents a substituted aryl group and substituted heteroaryl group combination, and the other of $Y_1$ and $Y_2$ represents a hydrogen atom;

wherein $X_1$, $X_3$, $X_4$ and $X_6$ independently represent deuterium atoms, and $X_2$ and $X_5$ independently represent tert-butyl groups; and wherein the compound has the following structure:

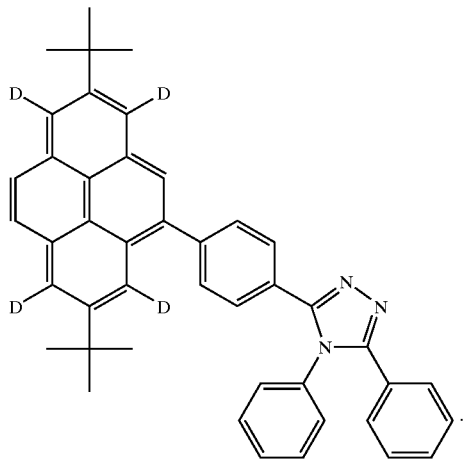

11. A pyrene based compound according to the following formula:

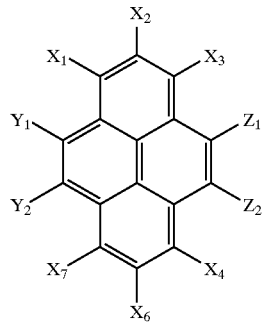

wherein $Z_1$ and $Z_2$ independently represent hydrogen atoms;

wherein one of $Y_1$ and $Y_2$ represents a silicon atom and substituted aryl group combination, and the other of $Y_1$ and $Y_2$ represents a hydrogen atom;

wherein $X_1$, $X_3$, $X_4$ and $X_6$ independently represent deuterium atoms, and $X_2$ and $X_5$ independently represent tert-butyl groups; and wherein the compound has the following structure:

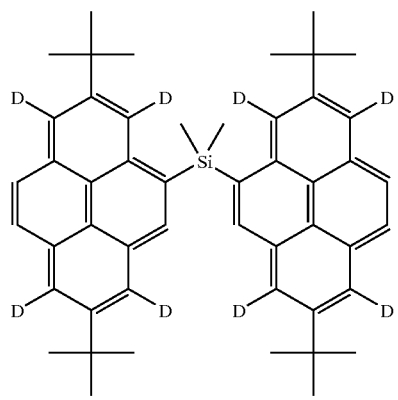

12. A pyrene based compound according to the following formula:

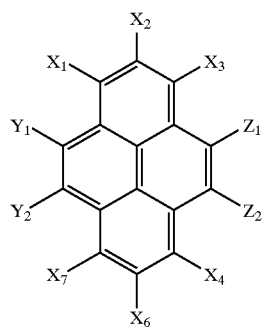

wherein $Z_1$ and $Z_2$ independently represent hydrogen atoms;

wherein one of $Y_1$ and $Y_2$ represents a substituted aryl group, and the other of $Y_1$ and $Y_2$ represents a hydrogen atom;

wherein $X_1$, $X_3$, $X_4$ and $X_6$ independently represent deuterium atoms, and $X_2$ and $X_5$ independently represent tert-butyl groups; and wherein the compound has the following structure:

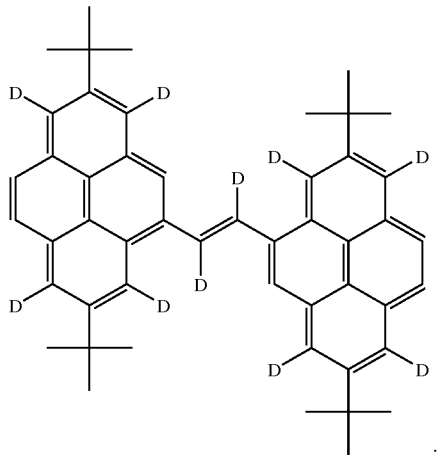

13. A pyrene based compound according to the following formula:

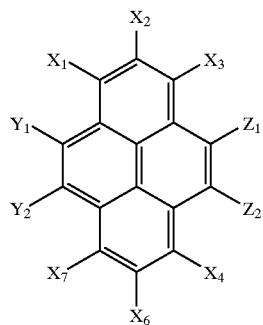

wherein $Z_1$ and $Z_2$ independently represent hydrogen atoms;

wherein one of $Y_1$ and $Y_2$ represents a substituted aryl group, and the other of $Y_1$ and $Y_2$ represents a hydrogen atom;

wherein $X_1$, $X_3$, $X_4$ and $X_6$ independently represent deuterium atoms, and $X_2$ and $X_5$ independently represent tert-butyl groups; and wherein the compound has the following structure:

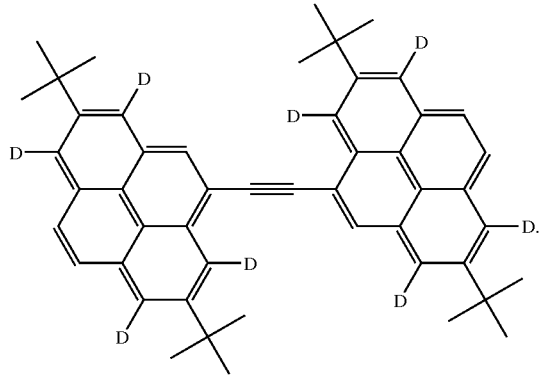

14. A pyrene based compound according to the following formula:

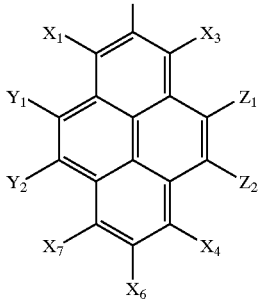

wherein $Z_1$ and $Z_2$ independently represent hydrogen atoms;

wherein one of $Y_1$ and $Y_2$ represents an oxygen atom and substituted aryl group combination, and the other of $Y_1$ and $Y_2$ represents a hydrogen atom;

wherein $X_1$, $X_3$, $X_4$ and $X_6$ independently represent deuterium atoms, and $X_2$ and $X_5$ independently represent tert-butyl groups; and wherein the compound has the following structure:

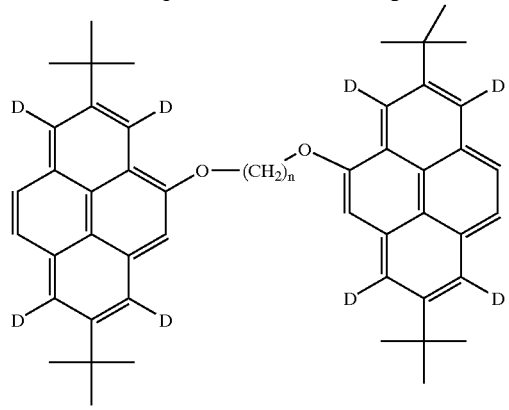

15. An organic light emitting device comprising an anode, a cathode and at least one organic layer sandwiched between the anode and the cathode, wherein the organic layer comprises a pyrene based compound of the following general formula:

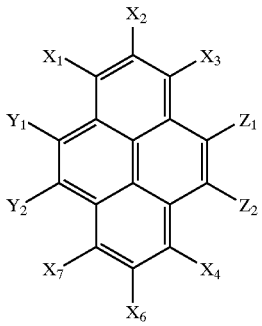

wherein $Z_1$ represents a hydrogen atom, deuterium atom, oxygen atom, silicon atom, selenium atom, substituted or unsubstituted aryl group, substituted or unsubstituted heteroaryl group, substituted or unsubstituted aryl amine or a combination thereof, and $Z_2$ represents a hydrogen or deuterium atom;

wherein one of $Y_1$ and $Y_2$ represents a hydrogen atom, deuterium atom, oxygen atom, silicon atom, selenium atom, a substituted or unsubstituted aryl group, substituted or unsubstituted heteroaryl group, substituted or unsubstituted aryl amine or a combination thereof, and the other of $Y_1$ and $Y_2$ represents a hydrogen or deuterium atom;

wherein $X_1$ through $X_6$ independently represent hydrogen atoms, deuterium atoms, alkyl groups or aryl groups, and at least one of $X_1$ through $X_6$ represents a tert-butyl group; and wherein at least one of $X_1$ through $X_6$, $Y_1$, $Y_2$, $Z_1$, and $Z_2$ represents a deuterium atom.

16. The organic light emitting device of claim 15, wherein the organic layer is an emissive layer, a hole transport layer, an electron transport layer or combinations thereof.

17. The organic light emitting device of claim 15, wherein the pyrene based compound serves as a host material of said organic layer.

18. The organic light emitting device of claim 15, wherein the pyrene based compound serves as a dopant of said organic layer.

19. The organic light emitting device of claim 15, wherein $Z_1$ and one of $Y_1$ and $Y_2$ independently represent a hole injection chromophore, an electron injection chromophore, or both.

20. The organic light emitting device of claim 15, wherein $Z_1$ and one of $Y_1$ and $Y_2$ independently represent a cross-linking group.

21. The organic light emitting device of claim 20, wherein the cross-linking group comprises a di-vinyl group.

22. The organic light emitting device of claim 15, wherein $Z_1$ and one of $Y_1$ and $Y_2$ independently represent a benzene ring substituted with one or two pyrenyl groups.

23. The organic light emitting device of claim 15, wherein the pyrene based compound has the following structure:

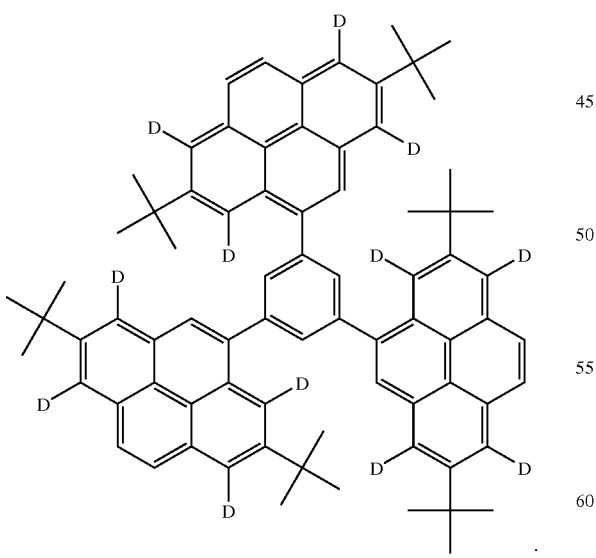

24. The organic light emitting device of claim 15, wherein the compound has the following structure:

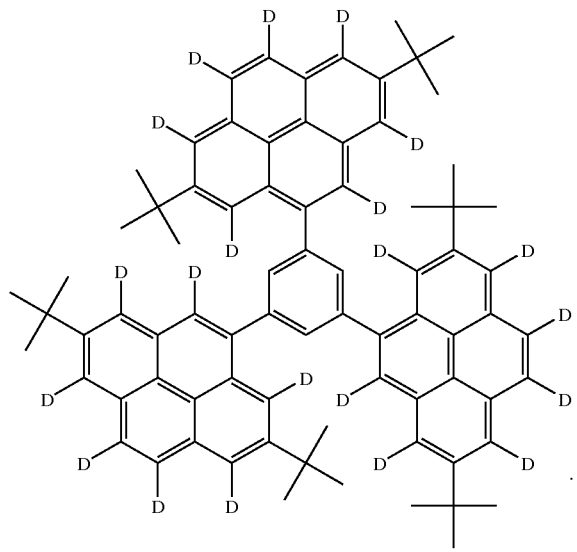

25. The organic light emitting device of claim 15, wherein the pyrene based compound has the following structure:

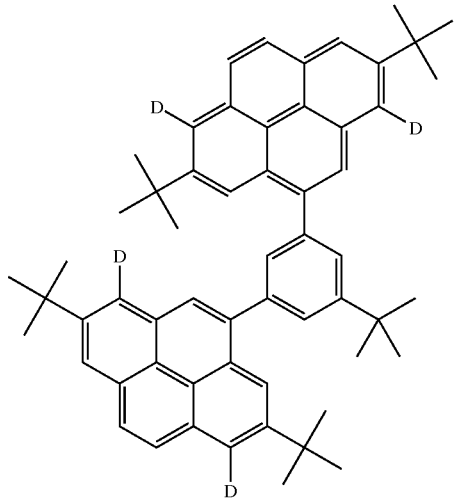

26. The organic light emitting device of claim 15, wherein the pyrene based compound has the following structure:

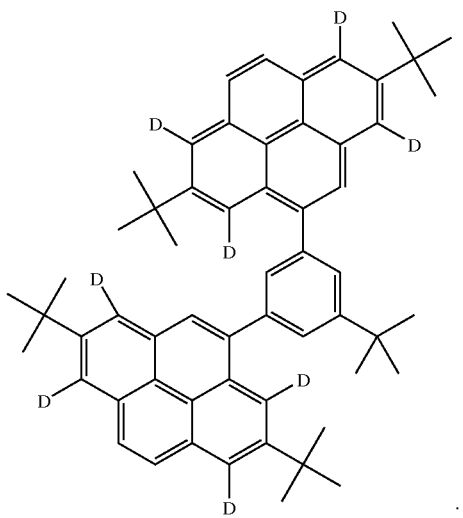

27. The organic light emitting device of claim 15, wherein the pyrene based compound has the following structure:

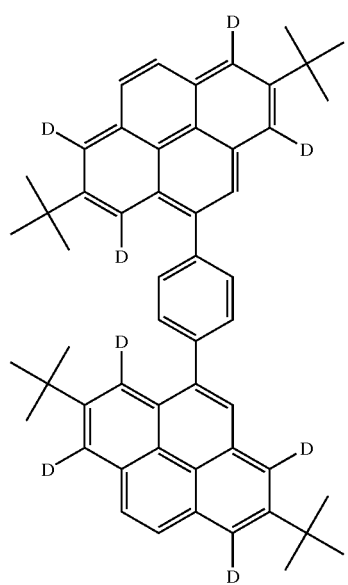

28. The organic light emitting device of claim 15, wherein the pyrene based compound has the following structure:

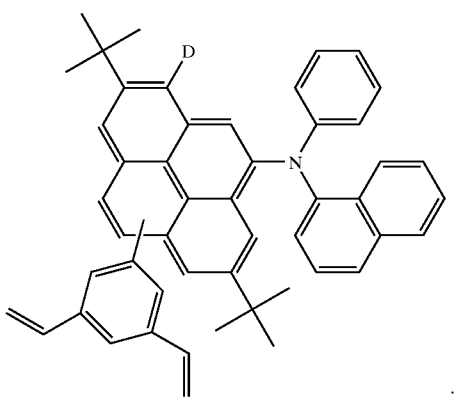

29. The organic light emitting device of claim 15, wherein the pyrene based compound has the following structure:

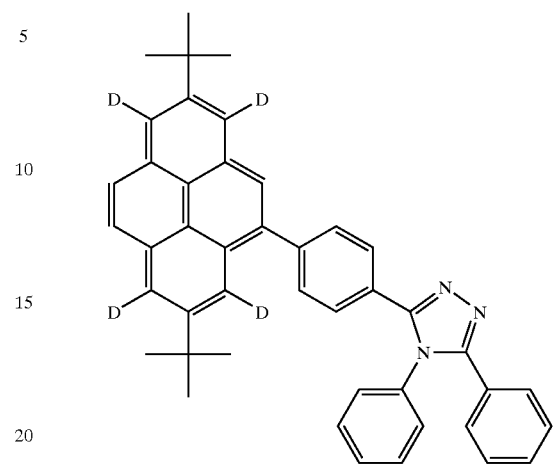

30. The organic light emitting device of claim 15, wherein the pyrene based compound has the following structure:

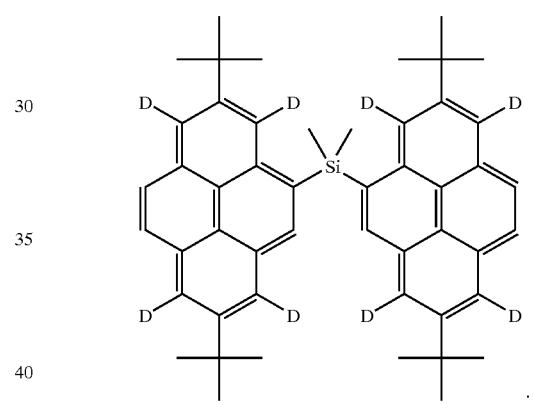

31. The organic light emitting device of claim 15, wherein the pyrene based compound has the following structure:

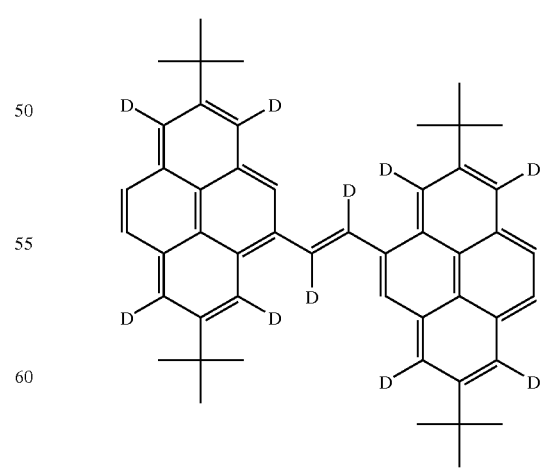

32. The organic light emitting device of claim 15, wherein the pyrene based compound has the following structure:

33. The organic light emitting device of claim 15, wherein the pyrene based compound has the following structure:
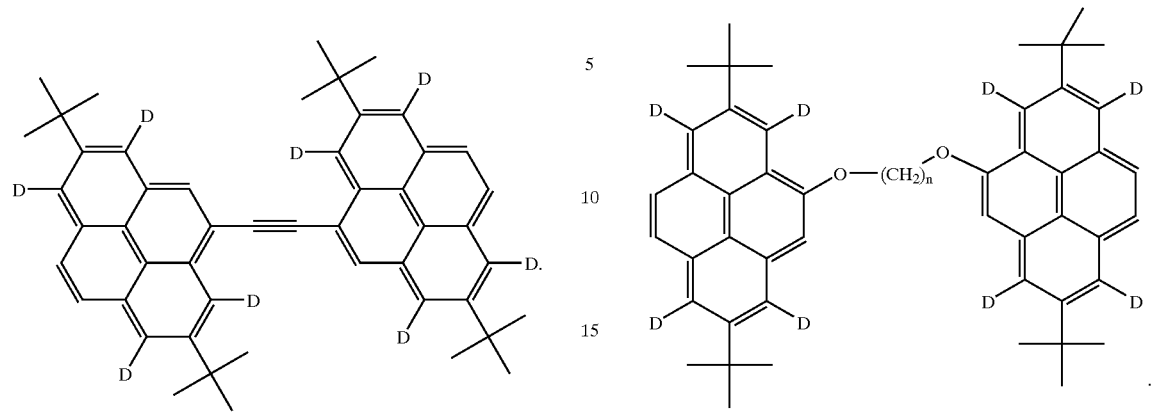
* * * * *

UNITED STATES PATENT AND TRADEMARK OFFICE
CERTIFICATE OF CORRECTION

PATENT NO. : 6,852,429 B1
DATED : February 8, 2005
INVENTOR(S) : Xiao-Chang Charles Li et al.

It is certified that error appears in the above-identified patent and that said Letters Patent is hereby corrected as shown below:

Title page,
Item [57], ABSTRACT,

Line 21, " 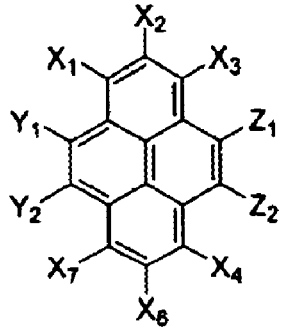 " should read -- 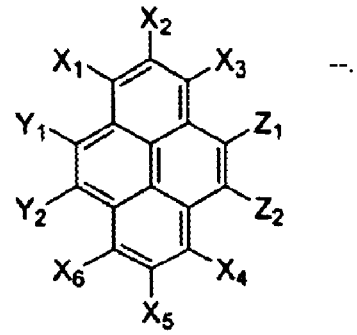 --.

Column 1,
Line 52, "triarylamnine-based" should read -- triarylamine-based --.

Column 3,
Line 60, "through $X_5$" should read -- through $X_6$ --.

Column 4,

Line 15, " 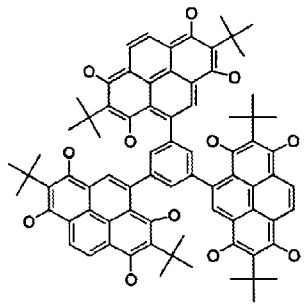 " should read -- 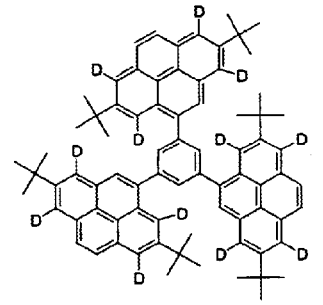 --;

Line 35, " 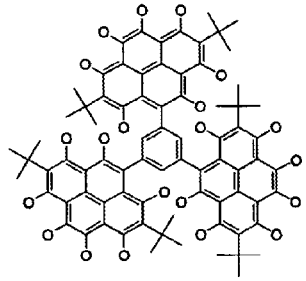 " should read -- 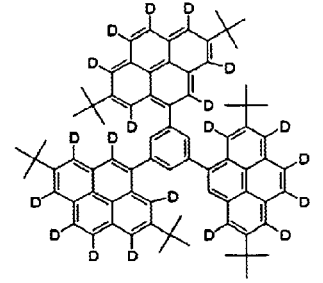 --; and

UNITED STATES PATENT AND TRADEMARK OFFICE
CERTIFICATE OF CORRECTION

PATENT NO.    : 6,852,429 B1
DATED         : February 8, 2005
INVENTOR(S)   : Xiao-Chang Charles Li et al.

It is certified that error appears in the above-identified patent and that said Letters Patent is hereby corrected as shown below:

Column 4 (cont'd),

Line 60, " 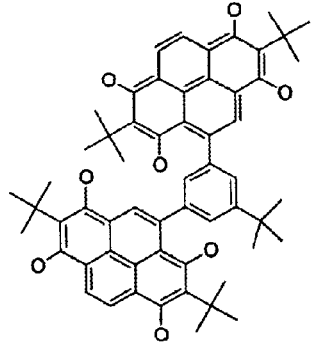 " should read -- 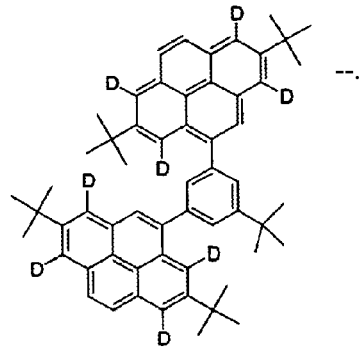 --.

Column 5,

Line 15, " 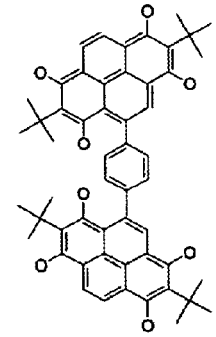 " should read -- 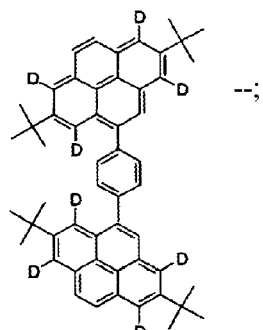 --;

Line 35, " 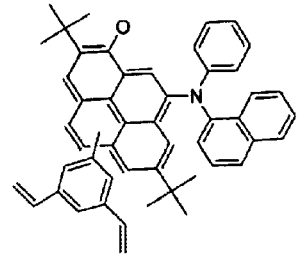 " should read -- 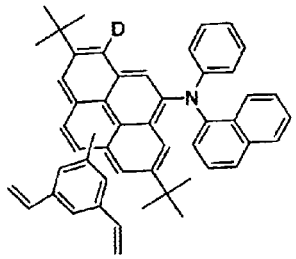 --;

Line 60, " 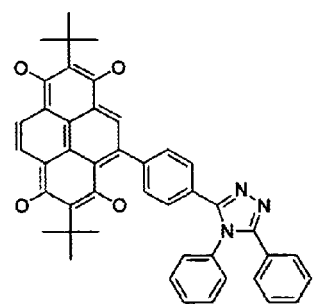 " should read -- 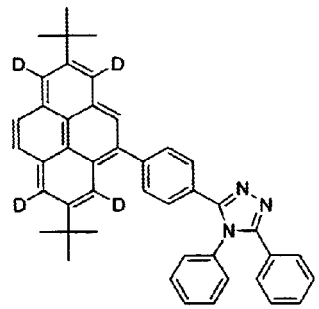 --.

UNITED STATES PATENT AND TRADEMARK OFFICE
CERTIFICATE OF CORRECTION

PATENT NO.     : 6,852,429 B1  
DATED          : February 8, 2005  
INVENTOR(S)    : Xiao-Chang Charles Li et al.

Page 3 of 12

It is certified that error appears in the above-identified patent and that said Letters Patent is hereby corrected as shown below:

Column 6,

Line 10, " 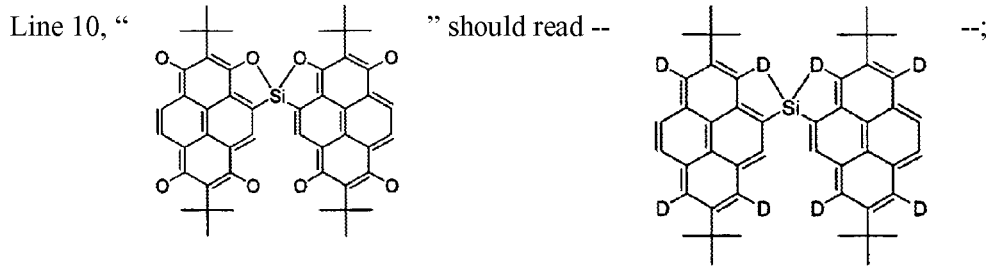 " should read -- --;

Line 35, " 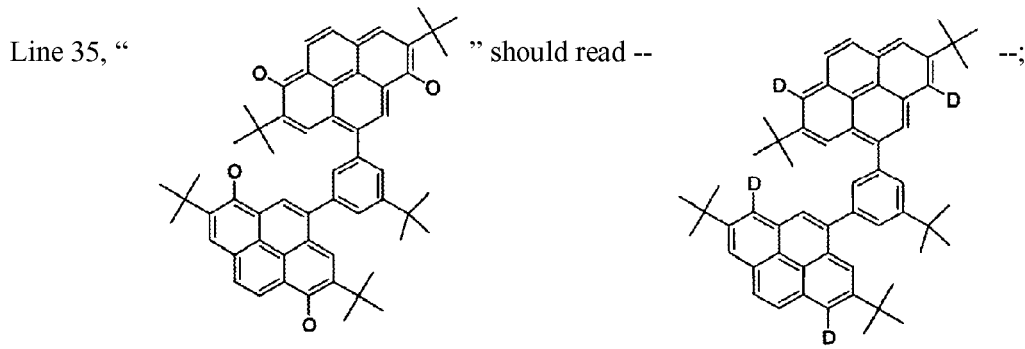 " should read -- --;

Line 55, " 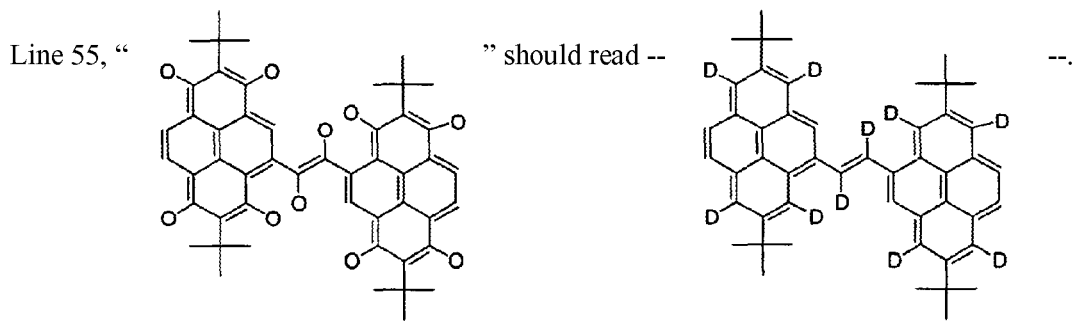 " should read -- --.

Column 7,

Line 10, " 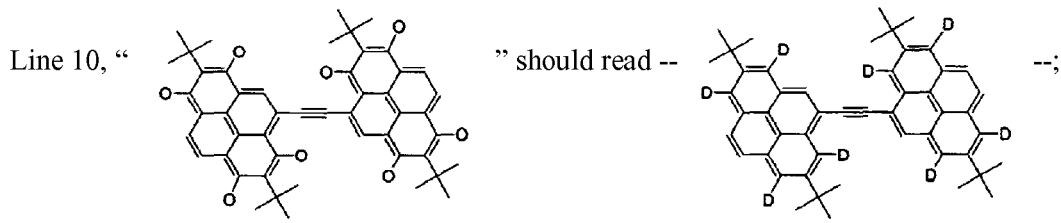 " should read -- --;

UNITED STATES PATENT AND TRADEMARK OFFICE
CERTIFICATE OF CORRECTION

PATENT NO. : 6,852,429 B1
DATED : February 8, 2005
INVENTOR(S) : Xiao-Chang Charles Li et al.

It is certified that error appears in the above-identified patent and that said Letters Patent is hereby corrected as shown below:

Column 7 (cont'd),

Line 25, " 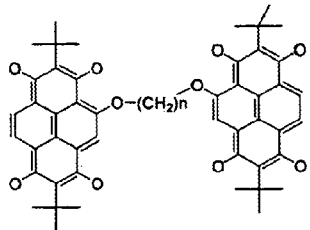 " should read -- 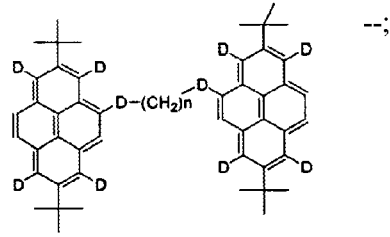 --;

Line 39, "missive" should read -- emissive --.

Column 9,

Line 15, " 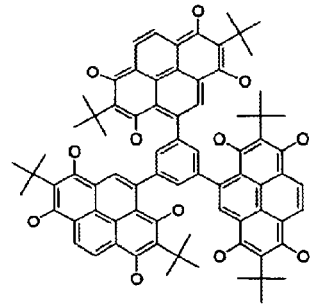 " should read -- 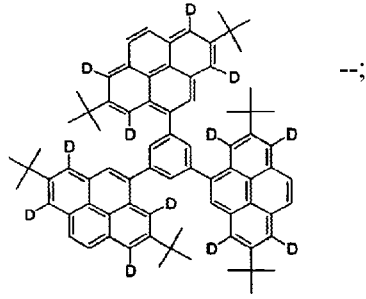 --;

Line 35, " 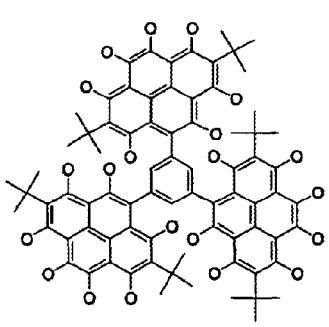 " should read -- 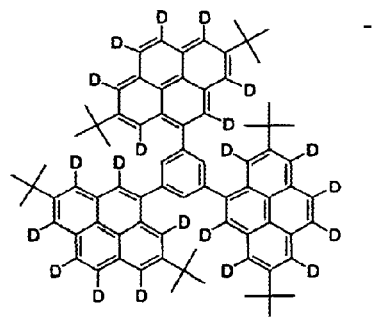 --;

Line 60, " 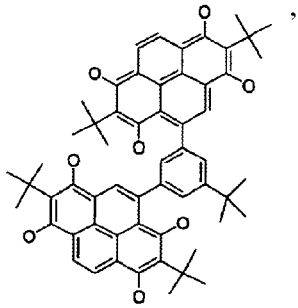 " should read -- 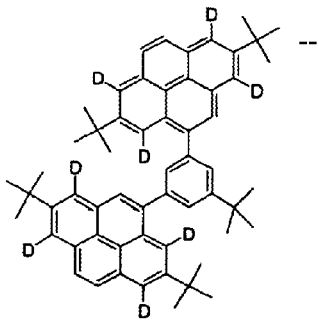 --.

UNITED STATES PATENT AND TRADEMARK OFFICE
CERTIFICATE OF CORRECTION

PATENT NO. : 6,852,429 B1
DATED : February 8, 2005
INVENTOR(S) : Xiao-Chang Charles Li et al.

It is certified that error appears in the above-identified patent and that said Letters Patent is hereby corrected as shown below:

Column 10,

Line 15, " 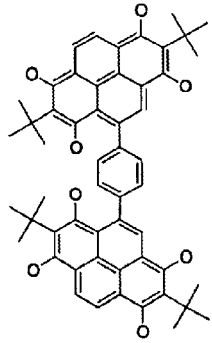 " should read -- 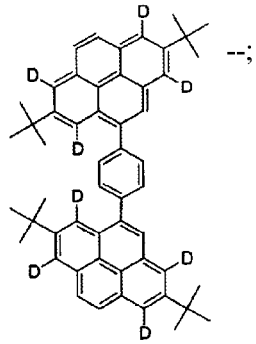 --;

Line 35, " 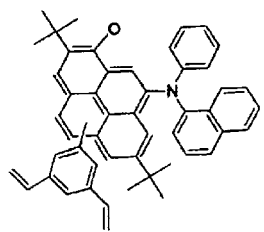 " should read -- 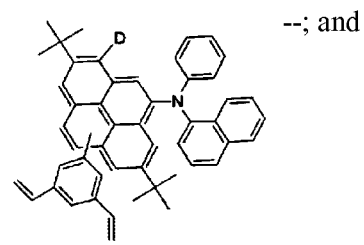 --; and

Line 60, " 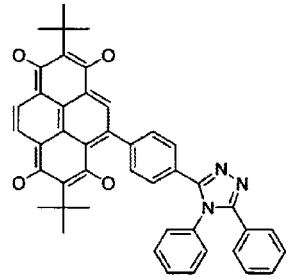 " should read -- 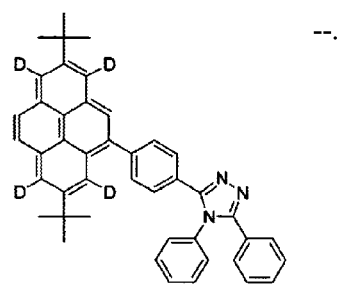 --.

Column 11,

Line 10, " 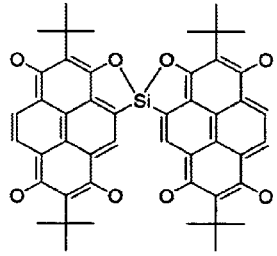 " should read -- 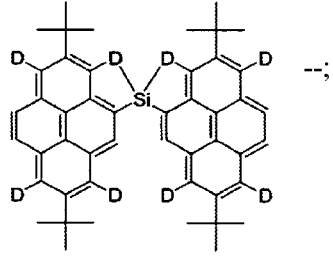 --;

UNITED STATES PATENT AND TRADEMARK OFFICE
CERTIFICATE OF CORRECTION

PATENT NO. : 6,852,429 B1
DATED : February 8, 2005
INVENTOR(S) : Xiao-Chang Charles Li et al.

It is certified that error appears in the above-identified patent and that said Letters Patent is hereby corrected as shown below:

Column 11 (cont'd),

Line 25, " 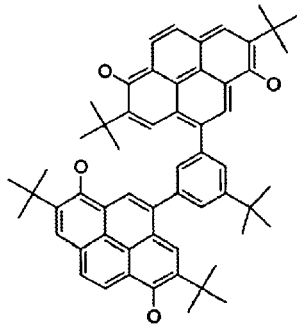 " should read -- 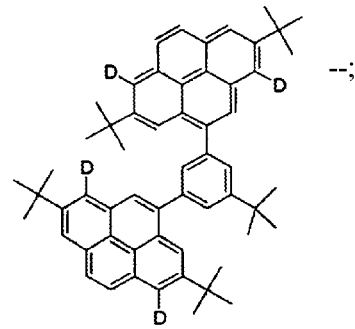 --;

Line 45, " 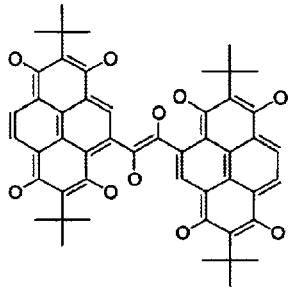 " should read -- 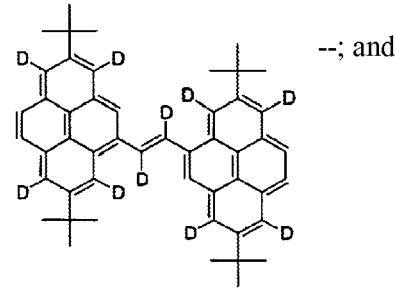 --; and

Line 60, " 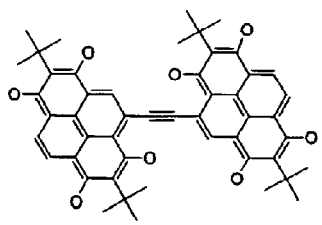 " should read -- 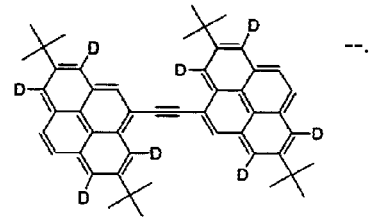 --.

Column 12,

Line 10, " 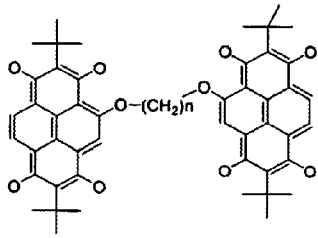 " should read -- 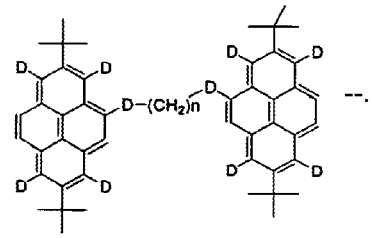 --.

UNITED STATES PATENT AND TRADEMARK OFFICE
CERTIFICATE OF CORRECTION

PATENT NO. : 6,852,429 B1
DATED : February 8, 2005
INVENTOR(S) : Xiao-Chang Charles Li et al.

It is certified that error appears in the above-identified patent and that said Letters Patent is hereby corrected as shown below:

Column 13,
Line 3, "can as" should read -- can be used as --; and

Line 30, " 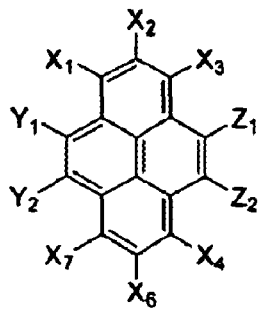 " should read -- 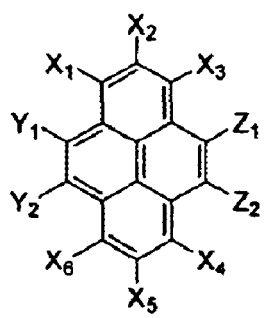 --.

Column 14,

Line 5, " 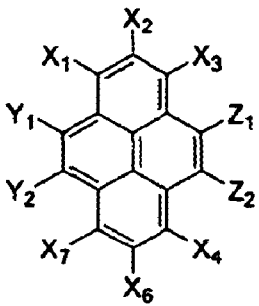 " should read -- 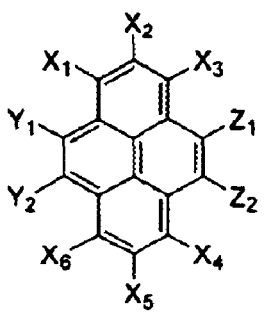 --;

Line 19, "heteraoryl" should read -- heteroaryl --; and

Line 50, " 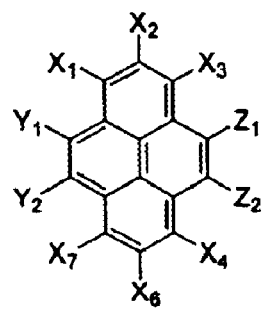 " should read -- 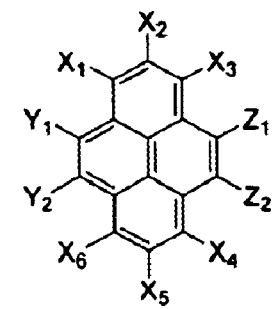 --.

UNITED STATES PATENT AND TRADEMARK OFFICE
CERTIFICATE OF CORRECTION

PATENT NO. : 6,852,429 B1
DATED : February 8, 2005
INVENTOR(S) : Xiao-Chang Charles Li et al.

It is certified that error appears in the above-identified patent and that said Letters Patent is hereby corrected as shown below:

Column 15,

Line 20, " 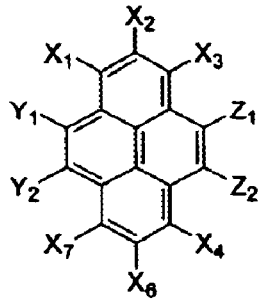 " should read -- 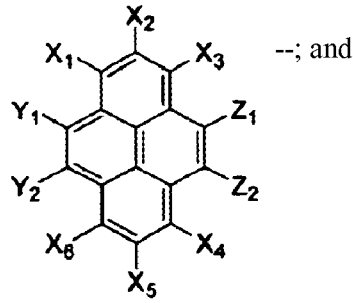 --; and

Line 55, " 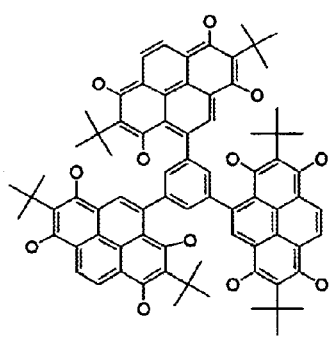 " should read -- 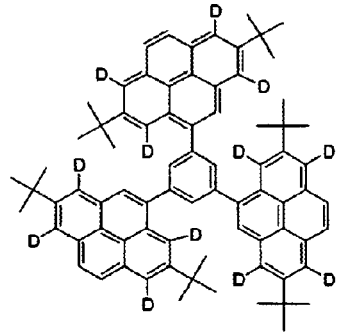 --.

Column 16,

Line 5, " 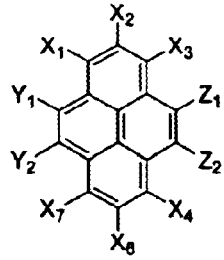 " should read -- 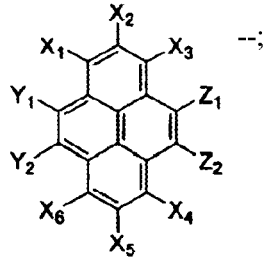 --;

UNITED STATES PATENT AND TRADEMARK OFFICE
CERTIFICATE OF CORRECTION

PATENT NO. : 6,852,429 B1
DATED : February 8, 2005
INVENTOR(S) : Xiao-Chang Charles Li et al.

It is certified that error appears in the above-identified patent and that said Letters Patent is hereby corrected as shown below:

Column 16 (cont'd),

Line 40, " 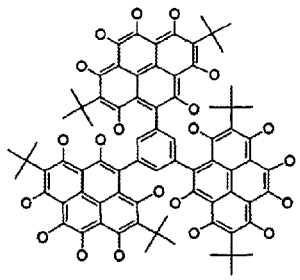 " should read -- 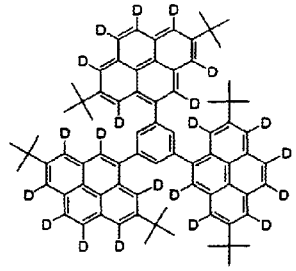 --; and

Line 60, " 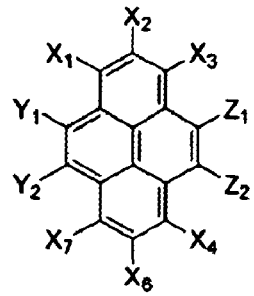 " should read -- 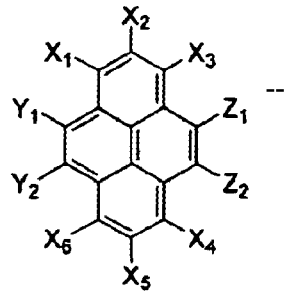 --.

Column 17,
Line 2, "atoms," should read -- atoms; --;
Line 4, "deute-" should read -- hydrogen --;
Line 5, "rium" should be deleted;
Line 6, "X3" should read -- $X_3$, --;

Line 20, " 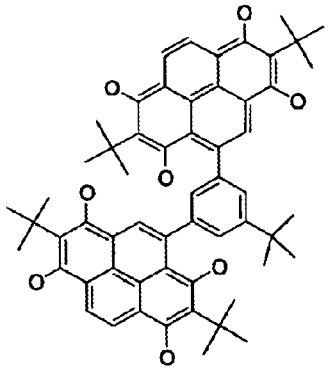 " should read -- 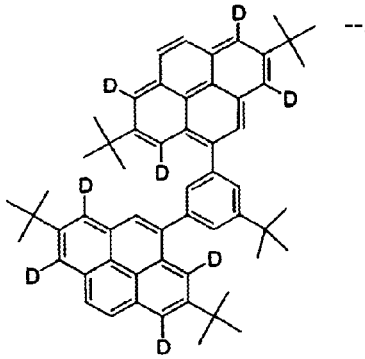 --;

UNITED STATES PATENT AND TRADEMARK OFFICE
CERTIFICATE OF CORRECTION

PATENT NO. : 6,852,429 B1
DATED : February 8, 2005
INVENTOR(S) : Xiao-Chang Charles Li et al.

It is certified that error appears in the above-identified patent and that said Letters Patent is hereby corrected as shown below:

Column 17 (cont'd),

Line 45, " 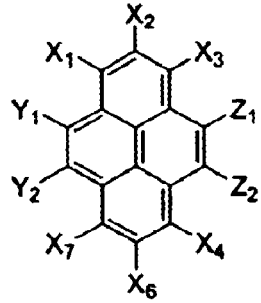 " should read -- 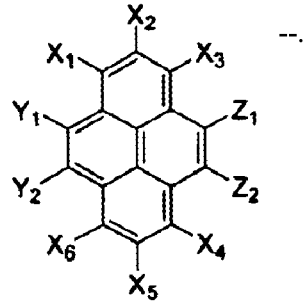 --.

Column 18,

Line 20, " 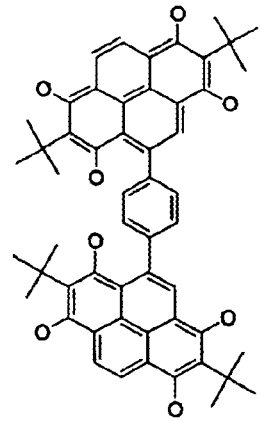 " should read -- 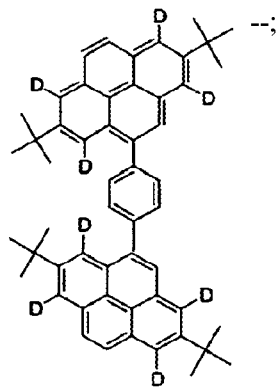 --;

Line 45, " 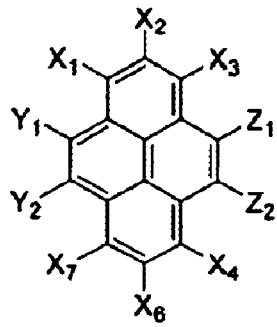 " should read -- 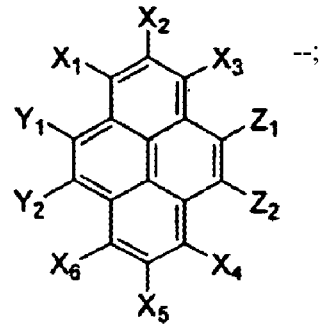 --;

Line 60, "atoms" should read -- atoms, --.

UNITED STATES PATENT AND TRADEMARK OFFICE
CERTIFICATE OF CORRECTION

PATENT NO. : 6,852,429 B1
DATED : February 8, 2005
INVENTOR(S) : Xiao-Chang Charles Li et al.

It is certified that error appears in the above-identified patent and that said Letters Patent is hereby corrected as shown below:

Column 19,

Line 10, " 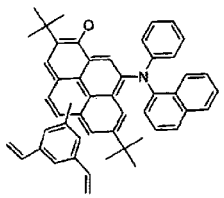 " should read -- 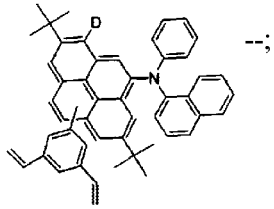 --;

Line 30, " 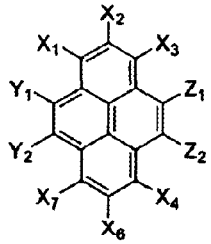 " should read -- 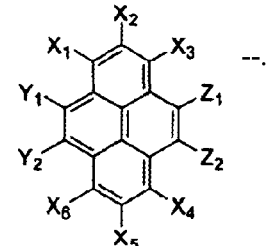 --.

Column 20,

Line 1, " 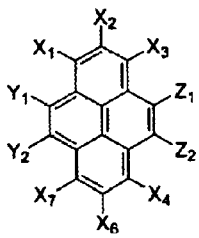 " should read -- 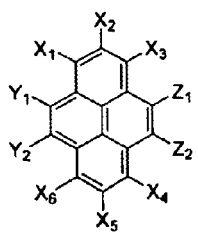 --; and

Line 50, " 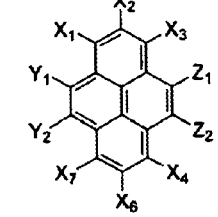 " should read -- 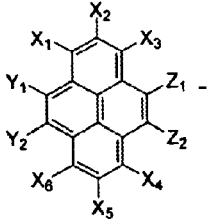 --.

Column 21,

Line 30, " 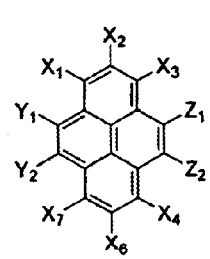 " should read -- 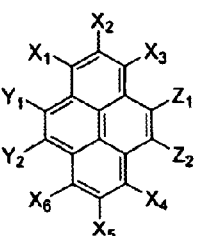 --.

UNITED STATES PATENT AND TRADEMARK OFFICE
CERTIFICATE OF CORRECTION

PATENT NO. : 6,852,429 B1
DATED : February 8, 2005
INVENTOR(S) : Xiao-Chang Charles Li et al.

It is certified that error appears in the above-identified patent and that said Letters Patent is hereby corrected as shown below:

Column 22,

Line 1, " 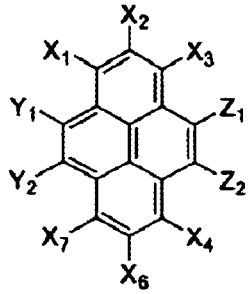 " should read -- 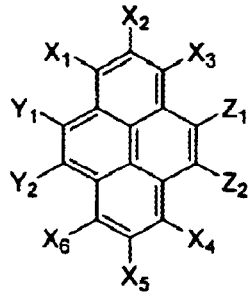 --; and

Line 55, " 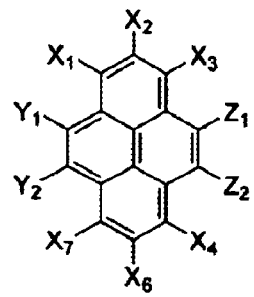 " should read -- 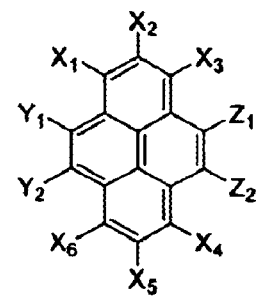 --.

Signed and Sealed this

Eighteenth Day of April, 2006

JON W. DUDAS
*Director of the United States Patent and Trademark Office*